US012310228B2

(12) United States Patent
Sano

(10) Patent No.: US 12,310,228 B2
(45) Date of Patent: May 20, 2025

(54) FLEXIBLE SUBSTRATE

(71) Applicant: Japan Display Inc., Tokyo (JP)

(72) Inventor: Takumi Sano, Tokyo (JP)

(73) Assignee: Japan Display Inc., Tokyo (JP)

(*) Notice: Subject to any disclaimer, the term of this patent is extended or adjusted under 35 U.S.C. 154(b) by 505 days.

(21) Appl. No.: 17/869,287

(22) Filed: Jul. 20, 2022

(65) Prior Publication Data

US 2022/0359840 A1  Nov. 10, 2022

Related U.S. Application Data

(63) Continuation of application No. PCT/JP2020/040958, filed on Oct. 30, 2020.

(30) Foreign Application Priority Data

Jan. 21, 2020 (JP) ................................ 2020-007657

(51) Int. Cl.
*H10K 77/10* (2023.01)
*H05K 1/02* (2006.01)
*H10N 30/098* (2023.01)

(52) U.S. Cl.
CPC ........... *H10K 77/111* (2023.02); *H05K 1/028* (2013.01); *H10N 30/098* (2023.02); *H05K 2201/10151* (2013.01)

(58) Field of Classification Search
CPC .. H10K 77/111; H10K 59/131; H10K 59/179; H05K 1/028; H05K 2201/10151; H05K 1/185; H05K 1/189; H10N 30/098; H10N 39/00; H10N 30/302; H01L 25/0753
See application file for complete search history.

(56) References Cited

U.S. PATENT DOCUMENTS

| | | | |
|---|---|---|---|
| 7,893,474 B2* | 2/2011 | So ........................ | H10N 39/00 257/295 |
| 10,964,769 B2* | 3/2021 | Park ..................... | H10K 59/124 |
| 2011/0261021 A1 | 10/2011 | Modarres et al. | |
| 2014/0191221 A1* | 7/2014 | Benwadih ............... | G01L 9/008 257/40 |

(Continued)

FOREIGN PATENT DOCUMENTS

| | | |
|---|---|---|
| JP | S56-92634 A | 7/1981 |
| JP | 2011-242386 A | 12/2011 |

(Continued)

OTHER PUBLICATIONS

International Search Report issued in International Patent Application No. PCT/JP2020/040958 on Dec. 22, 2020 and English translation of same. 5 pages.

(Continued)

*Primary Examiner* — Dao H Nguyen
(74) *Attorney, Agent, or Firm* — K&L Gates LLP

(57) ABSTRACT

According to one embodiment, a flexible substrate includes a line portion including a support plate including a first surface, a flexible insulating base located on the first surface and a wiring layer disposed on the insulating base, a piezoelectric material covering the line portion, a protective member located on the piezoelectric material and an island-shaped first electrode provided on the insulating base.

8 Claims, 10 Drawing Sheets

(56) References Cited

U.S. PATENT DOCUMENTS

| | | |
|---|---|---|
| 2015/0282294 A1 | 10/2015 | Wakuda et al. |
| 2015/0282296 A1 | 10/2015 | Ogura et al. |
| 2017/0003440 A1* | 1/2017 | Kim .................... G02B 6/0073 |
| 2017/0181276 A1 | 6/2017 | Sawada et al. |
| 2018/0046221 A1* | 2/2018 | Choi ...................... H05B 33/22 |
| 2018/0183438 A1 | 6/2018 | Shigetaka et al. |
| 2019/0013275 A1* | 1/2019 | Sunshine ............ H10H 20/854 |
| 2019/0087046 A1* | 3/2019 | Guo .................... G06F 3/04166 |
| 2019/0177160 A1* | 6/2019 | Qian ...................... H10N 39/00 |
| 2020/0133413 A1* | 4/2020 | Chen .................... H10N 30/302 |
| 2020/0147644 A1* | 5/2020 | Chang .................. B06B 1/0666 |

FOREIGN PATENT DOCUMENTS

| | | |
|---|---|---|
| JP | 2017-113088 A | 6/2017 |
| JP | 2017-118109 A | 6/2017 |
| JP | 2018-106616 A | 7/2018 |

OTHER PUBLICATIONS

Written Opinion issued in International Patent Application No. PCT/JP2020/040958 on Dec. 22, 2020. 3 pages.

* cited by examiner

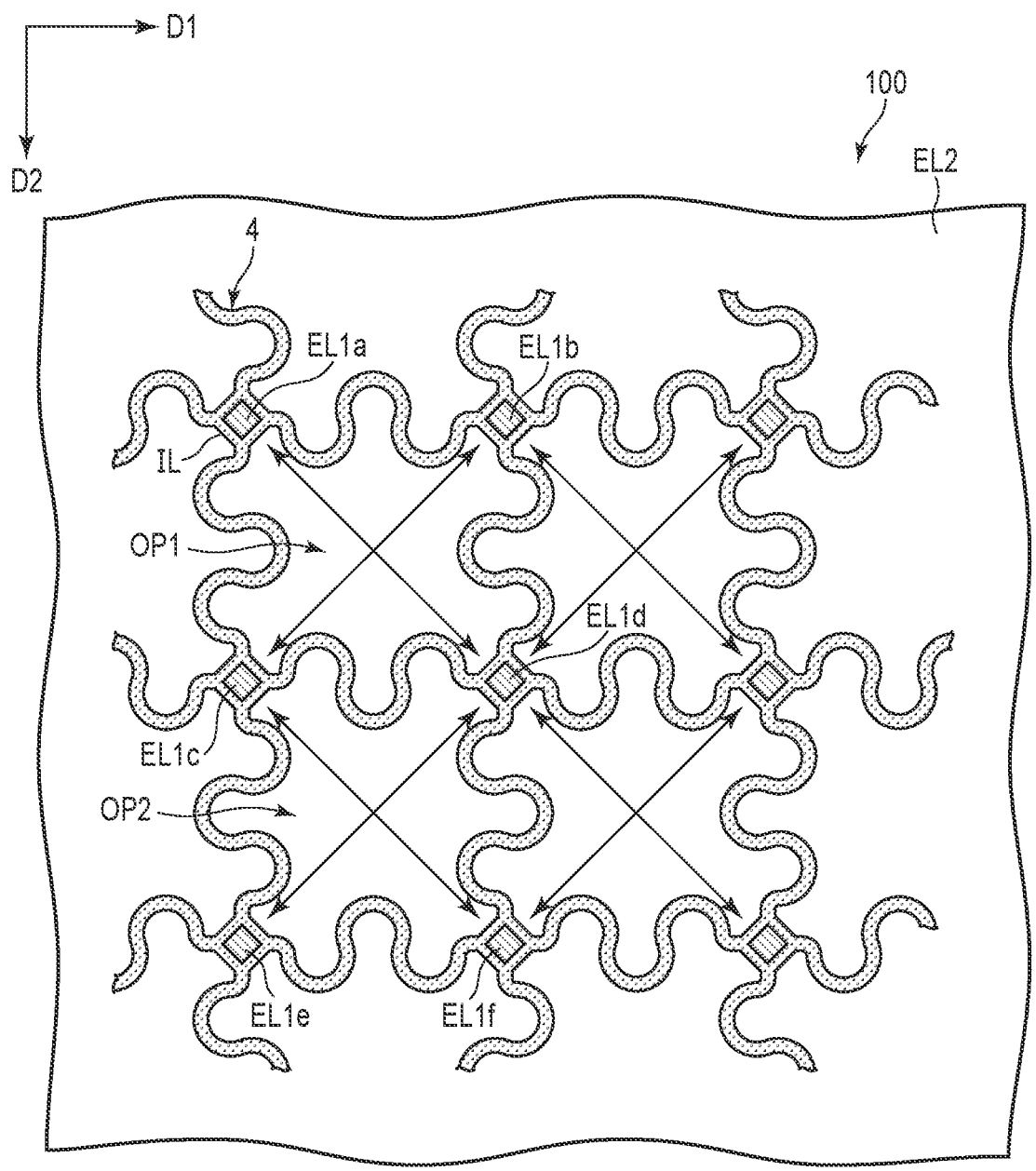
F I G. 14

FLEXIBLE SUBSTRATE

CROSS-REFERENCE TO RELATED APPLICATIONS

This application is a Continuation Application of PCT Application No. PCT/JP2020/040958, filed Oct. 30, 2020 and based upon and claiming the benefit of priority from Japanese Patent Application No. 2020-007657, filed Jan. 21, 2020, the entire contents of all of which are incorporated herein by reference.

FIELD

Embodiments described herein relate generally to a flexible substrate.

BACKGROUND

In recent years, the use of flexible substrates with flexibility and elasticity has been studied in various fields. For example, such use can be considered that a flexible substrate with electrical elements arrayed in a matrix shape is attached to a curved surface such as of the housing of an electronic device, human body or the like. As electrical elements, various sensors such as touch sensors and temperature sensors, display elements and the like can be applied.

BRIEF DESCRIPTION OF THE DRAWINGS

FIG. 14 is a plan view showing an electric field produced in a flexible substrate of the third embodiment.

DETAILED DESCRIPTION

Figure 1:
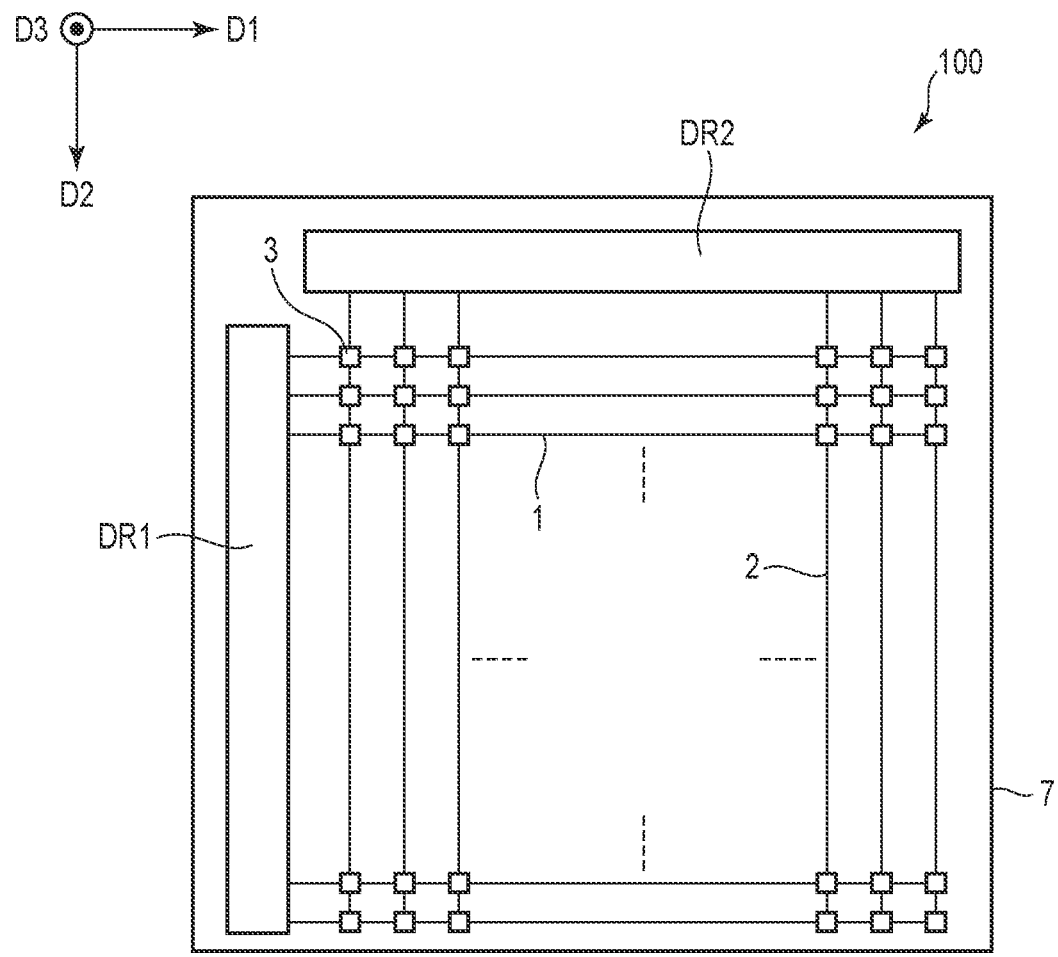
FIG. 1 is a plan view schematically showing a flexible substrate according to the first embodiment.

In general, according to one embodiment, a flexible substrate comprises a line portion including a support plate including a first surface, a flexible insulating base located on the first surface and a wiring layer disposed on the insulating base, a piezoelectric material covering the line portion, a protective member located on the piezoelectric material and an island-shaped first electrode provided on the insulating base.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

First, the first embodiment will be described.

FIG. 1 is a plan view schematically showing a flexible substrate 100 according to the first embodiment.

In this embodiment, a first direction D1, a second direction D2 and a third direction D3 are defined as shown in the figure. The first direction D1 and the second direction D2 are parallel to a main surface of the flexible substrate 10 and intersect each other. The third direction D3 is perpendicular to the first direction D1 and the second direction D2, and equivalent to the thickness direction of the flexible substrate 100. The first direction D1 and the second direction D2 intersect normal to each other in this embodiment, but they may intersect at an angle other than normal. In this specification, the direction toward the tip of the arrow indicating the third direction D3 is referred to as "upwards" and the direction from the tip of the arrow to the opposite direction is referred to as "downward". Further, it is assumed that there is an observation position for observing the flexible substrate 100 on the tip side of the arrow indicating the third direction D3, and viewing from this observation position toward a D1-D2 plane defined by the first direction D1 and the second direction D2 is called a planar view.

The flexible substrate 100 includes a plurality of scanning lines 1, a plurality of signal lines 2, a plurality of electrical elements 3, a support plate 7, a scanning line driver DR1 and a signal line driver DR2. The scanning lines 1, the signal lines 2, the electrical elements 3, the scanning line driver DR1 and the signal line driver DR2 are located on the support plate 7. The scanning lines 1 each extend along the first direction D1 and aligned along the second direction D2. The scanning lines 1 are each connected to the scanning line driver DR1. The signal lines 2 each extend along the second direction D2 and aligned along the first direction D1. The signal lines 2 are each connected to the signal line driver DR2. The electrical elements 3 are each located at an intersection between each scanning line 1 and each respective signal line 2 and are electrically connected to the scanning lines 1 and the signal lines 2, respectively. Details of the functions of the electrical elements 3 will be described below.

Figure 2:
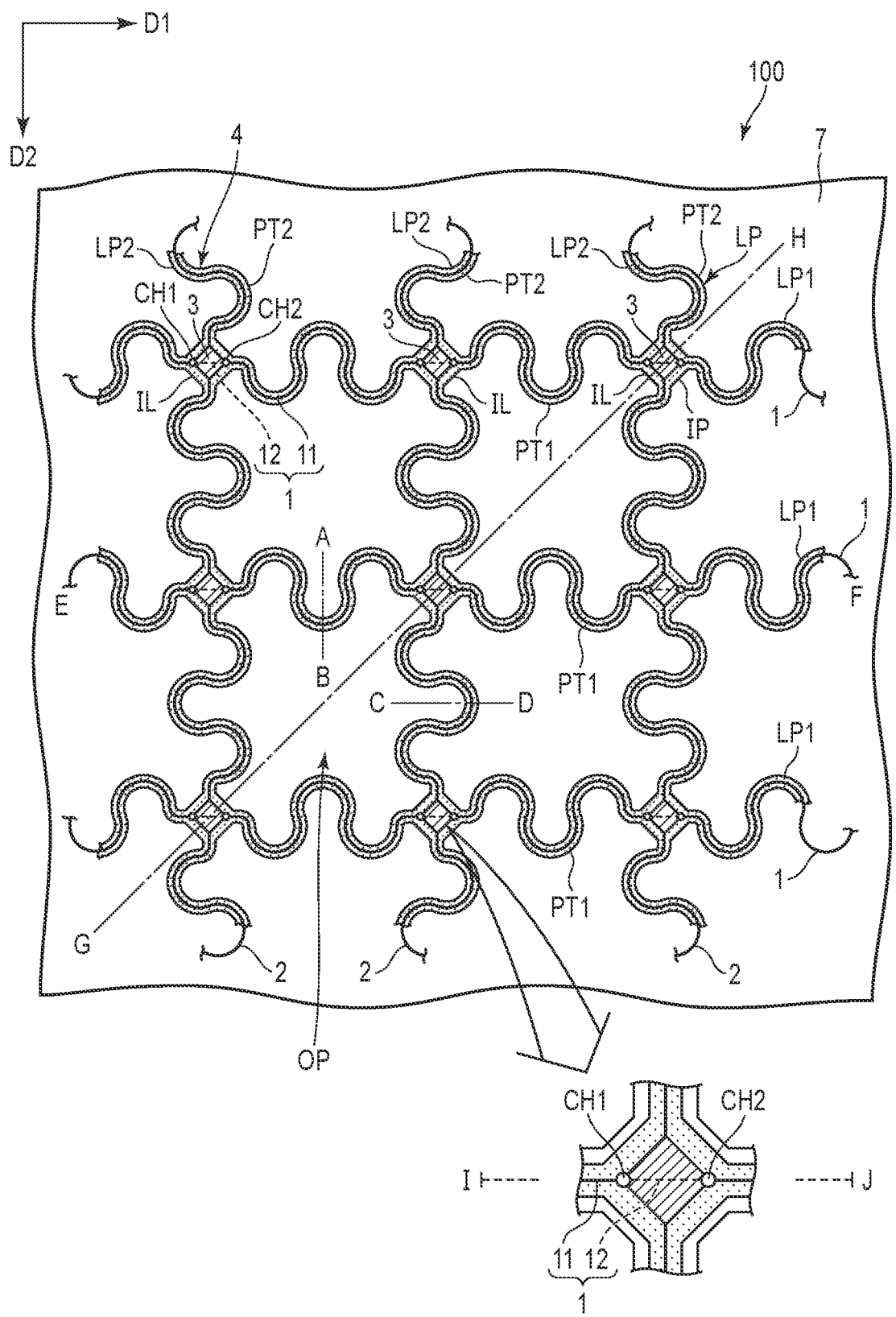
FIG. 2 is a partially enlarged plan view of a flexible substrate shown in FIG. 1.

FIG. 2 is a partially enlarged plan view of the flexible substrate 100 shown in FIG. 1.

The flexible substrate 100 comprises, in addition to those listed above, an insulating base 4 which supports the scanning lines 1 and the signal lines 2.

The insulating base 4 includes a plurality of first portions PT1 each extending along the first direction D1 and aligned along the second direction D2, a plurality of second portions PT2 each extending along the second direction D2 and aligned along the first direction D1, and island-shaped portions IL provided at respective intersections between the first portions PT1 and the second portions PT2. In plan view, the first portion PT1 and the second portion PT2 are each formed into a wavy shape. The island-shaped portions IL are each connected to the respective first portion PT1 and the respective second portion PT2. The insulating base 4 is flexible and can be formed of polyimide, for example, but it is not limited to this example.

The scanning lines 1 are located on the first portions PT1, respectively and are arranged in a wavy pattern. The signal lines 2 are located on the second portions PT2, respectively and are arranged in a wavy pattern. The scanning lines 1 and the signal lines 2 are examples of wiring lines provided on the flexible substrate 100. The scanning lines 1 and the signal lines 2 may be formed of a metal material or a transparent conductive material and may have a single-layer structure or a multi-layer structure. The flexible substrate 100 may comprise, in addition to the scanning lines 1 and the signal lines 2, other types of wiring lines including power lines which supply power to the electrical elements 3.

The scanning lines 1 each includes a first portion 11 indicated by solid line and a second portion 12 indicated by dotted line. The second portions 12 each overlap the electrical elements 3, respectively. The first portion 11 and the second portion 12 are located respectively in layers different from each other and are electrically connected to each other via contact holes CH1 and CH2.

The scanning lines 1 each supply a scanning signal to the respective electrical element 3. When, for example, the electrical element 3 is a sensor-type member, which outputs a signal output, an output signal from the respective electrical element 3 is supplied to the respective signal line 2. Further, when, for example, the electrical element 3 is of a type such as a light-emitting element or an actuator, which is actuated in response to an input signal, a drive signal is supplied to the signal line 2. A controller, which may include a supply source of scanning signals, a supply source of drive signals, a processor which processes output signals or the like, may be provided on the flexible substrate 100, or it may be provided on a device connected to the flexible substrate 100.

The electrical elements 3 are each located on the respective island-shaped portion IL. The electrical element 3 is smaller than the island-shaped portion IL, and in FIG. 2, the island-shaped portion IL expands out from an edge of the entire electrical element 3. For example, the electrical elements 3 are each a sensor, a semiconductor device, an actuator or the like. For example, as a sensor, an optical sensor which receives visible light or near-infrared light, a temperature sensor, a pressure sensor, a touch sensor or the like can be applied. For example, as a semiconductor element, a light-emitting element, a light-receiving element, a diode a transistor or the like can be applied. When the electrical elements 3 are light-emitting elements, a flexible display having flexibility and elasticity can be realized. As the light-emitting elements, for example, light-emitting diodes such as mini-LEDs or micro-LEDs or organic electroluminescent elements, having a size of around 100 µm can be applied. When the electrical elements 3 are actuators, for example, piezoelectric elements can be applied. Note that the electrical elements 3 are not limited to those listed as examples here, but other elements having various functions can as well be applied. The electrical elements 3 may be capacitors, resistors or the like. The arrangement positions and shape of the electrical elements 3 are not limited to those of the example illustrated in FIG. 2.

In this embodiment, the first portion PT1 and the second portion PT2 of the insulating base 4, the scanning lines 1, the signal lines 2, a first organic insulating film 5 and a second organic insulating film 6, which will be described later, are collectively referred to as line portions LP. The island-shaped portion IL of the insulating base 4, an inorganic insulating layer 19, which will be described later and the electrical elements 3 are collectively referred to as the island-shaped portions IP. The line portions LP are located on the support plate 7. The line portions LP include a plurality of wavy first line portions LP1 extending along the first direction D1 and arranged along the second direction D2, and a plurality of wavy second line portions LP2 extending along the second direction D2 and arranged along the first direction D1. The island-shaped portions IP are located in respective intersections between the first line portions LP1 and the second line portions LP2. The first line portions LP1 each include the respective first portion PT1 and the respective scanning line 1 of the insulating base 4. The second line portions LP2 each include the respective second portion PT 2 and the respective signal line 2 of the insulating base 4. Further, in each region enclosed by respective two adjacent first line portions LP1 and respective two adjacent second line portions LP2, no insulating base 4 is formed, but an opening OP is located. The openings OP are aligned in a matrix along the first direction D1 and the second direction D2.

Figure 3:
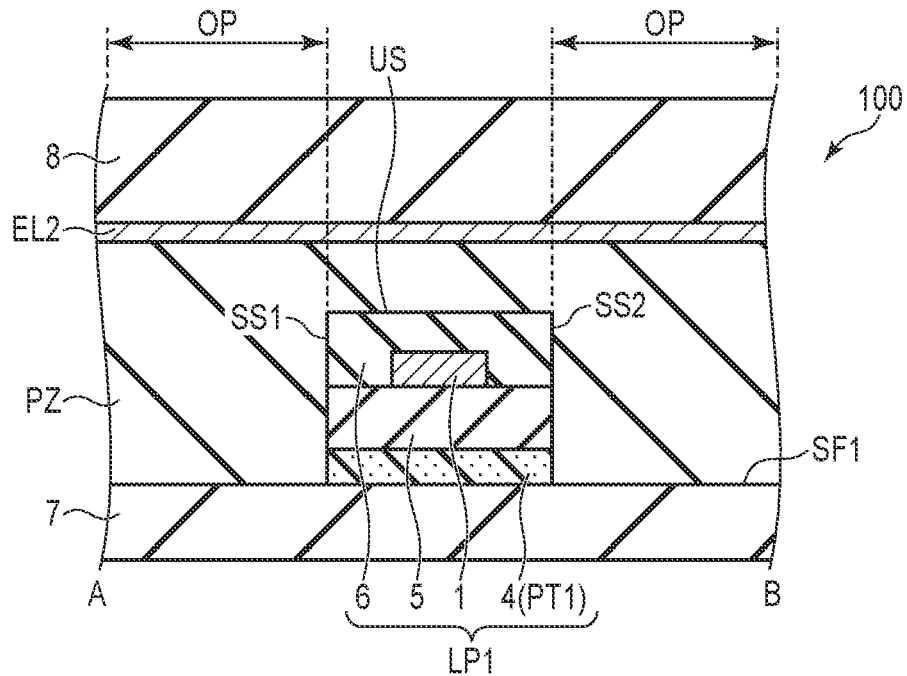
FIG. 3 is a cross-sectional view schematically showing a part of the flexible substrate shown in FIG. 2, taken along line A-B.

FIG. 3 is a cross-sectional view schematically showing a part of the flexible substrate 100 shown in FIG. 2, taken along line A-B.

The flexible substrate 100 includes, in addition to the elements described above, a first organic insulating film 5, a second organic insulating film 6, a protective member 8, a second electrode EL2 and an organic piezoelectric material PZ.

The support plate 7 includes a first surface SF1. The line portions LP1 are located on the first surface SF1. The line portions LP1 each includes a first side surface SS1, a second side surface SS2 on an opposite side to the first side surface SS1, and an upper surface US.

The first portions PT1 of the insulating base 4 are located on the first surface SF1. The first organic insulating film 5 covers the insulating base 4. The scanning lines 1 are located on the first organic insulating film 5. The second organic insulating film 6 covers the first organic insulating film 5 and the scanning lines 1. Both the first organic insulating film 5 and the second organic insulating film 6 are formed of an organic material.

The organic piezoelectric material PZ covers the first side surface SS1, the second side surface SS2 and the upper surface US of each first line portion LP1, and is in contact with the first surface SF1 of the support plate 7. In other words, the organic piezoelectric material PZ covers the scanning lines 1, the insulating base 4, the first organic insulating film 5 and the second organic insulating film 6. The organic piezoelectric material PZ is in contact with the insulating base 4, the first organic insulating film 5 and the second organic insulating film 6 of the first line portions LP1. Further, the organic piezoelectric material PZ is covered by the second electrode EL2. The second electrode EL2 opposes the first electrode EL1, which will be described later, via the organic piezoelectric material PZ. The organic piezoelectric material PZ is formed of an organic material and has elasticity. The organic piezoelectric material PZ is formed using, for example, lead zirconate titanate (PZT) or polyvinylidene fluoride (PVDF). The organic piezoelectric material PZ is applied on the first surface SF1 and cured, for example, by heat. The organic piezoelectric material PZ generates voltage when pressure is applied. The voltage is read by the electrical element 3 or the like. With the organic piezoelectric material PZ thus formed, a function of detecting pressure can be imparted to the flexible substrate 100.

The protective member 8 is located on the organic piezoelectric material PZ. The second electrode EL2 is located between the organic piezoelectric material PZ and the protective member 8. The protective member 8 is formed of a poly-para-xylylene (poly-p-xylylene:PPX) structure, for example, Parylene (registered trademark).

Figure 4:
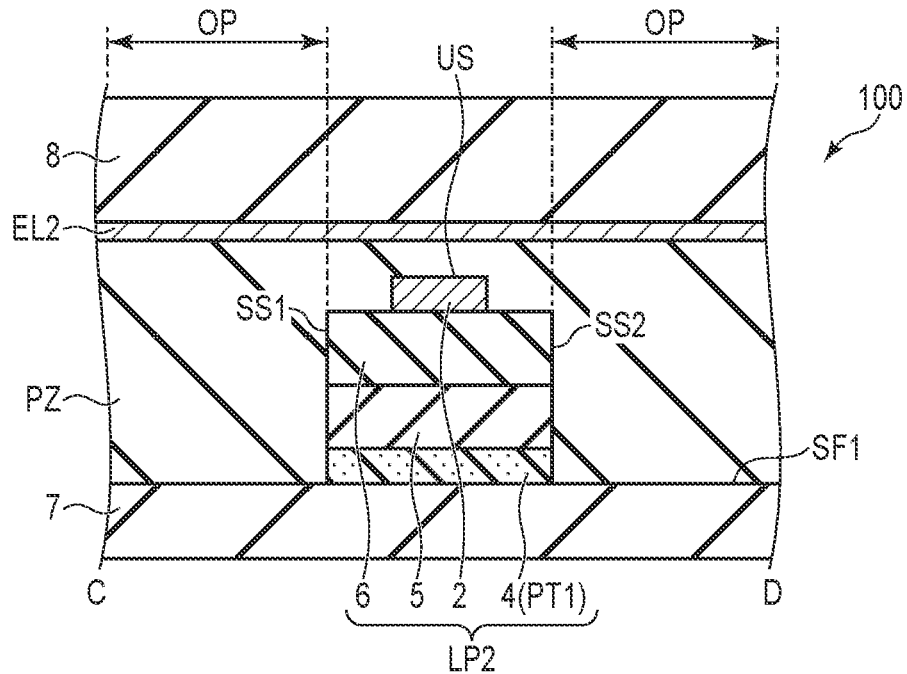
FIG. 4 is a cross-sectional view schematically showing a part of the flexible substrate shown in FIG. 2, taken along line C-D.

FIG. 4 is a cross-sectional view schematically showing a part of the flexible substrate 100 shown in FIG. 2, taken along line C-D.

The line portions LP2 are located on the first surface SF1 of the support plate 7. The second line portions LP2 each include a first side surface SS1, a second side surface SS2 on an opposite side to the first side surface SS1, and an upper surface US.

The second portions PT2 of the insulating base 4 are located on the first surface SF1 of the support plate 7. The first organic insulating film 5 covers the insulating base 4. The second organic insulating film 6 covers the first organic insulating film 5. The signal lines 2 are located on the second organic insulating film 6. The organic piezoelectric material PZ covers the first side surface SS1, the second side surface SS2 and the upper surface US of each second line portion LP2, and is in contact with the first surface SF1 of the support plate 7. In other words, the organic piezoelectric material PZ covers the insulating base 4, the first organic insulating film 5, the second organic insulating film 6 and the signal lines 2, and is in contact with each of them. As shown in FIGS. 3 and 4, the organic piezoelectric material PZ is located between the insulating base 4 and the protective material 8 in positions overlapping the first line portions LP1 and the second line portion LP2, and is located between the support plate 7 and the protective member 8 in the openings OP.

Figure 5:
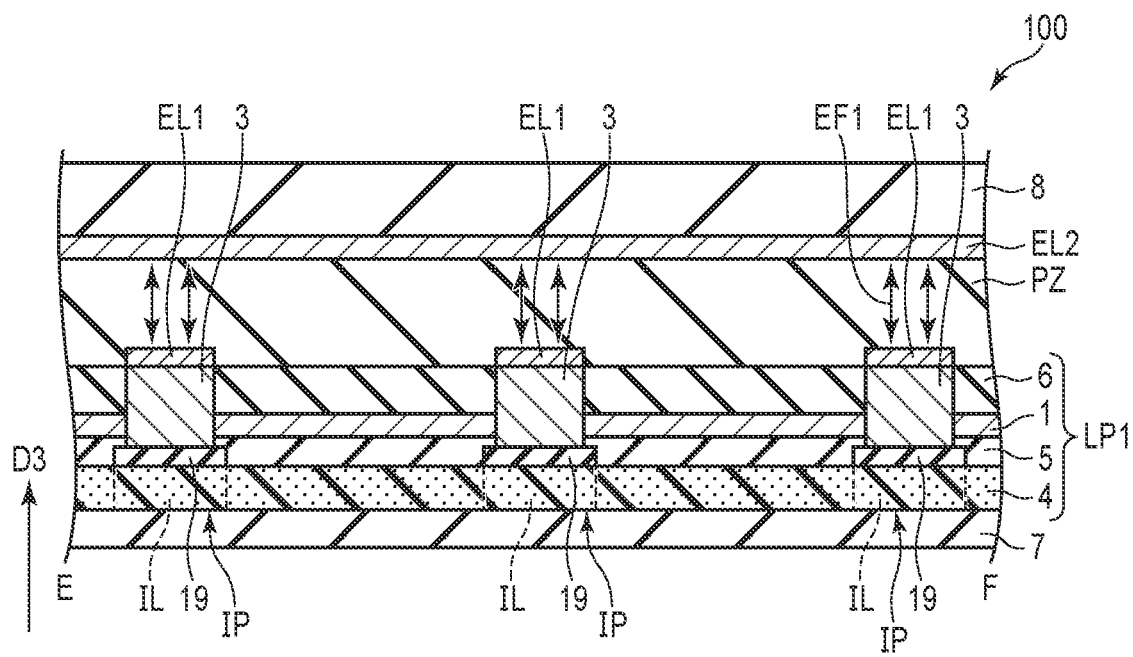
FIG. 5 is a cross-sectional view schematically showing a part of the flexible substrate shown in FIG. 2, taken along line E-F.

FIG. 5 is a cross-sectional view schematically showing a part of the flexible substrate 100 shown in FIG. 2, taken along line E-F.

The electrical elements 3 are disposed on the respective island-shaped portions IL of the insulating base 4. Between each electrical element 3 and the respective island-shaped portion IL, an inorganic insulating layer 19 (passivation layer) is disposed. The inorganic insulating layer 19 is formed into an island shape to be superimposed on the electrical element 3 (or the island-shaped portion IL) in plan view.

The flexible substrate 100 comprises island-shaped first electrodes EL provided on the insulating base 4. The first electrodes EL1 are located on the respective island-shaped portions IL of the insulating base 4. In the example illustrated, the first electrodes EL1 are located on the electrical elements, respectively 3. The organic piezoelectric material PZ is in contact with the first electrodes EL1. The organic piezoelectric material PZ covers the first line portions LP1 and the island-shaped portions IP. The second electrode EL2 opposes the first electrodes EL1 via the organic piezoelectric material PZ. In the example illustrated, the second electrode EL2 continuously opposes the multiple first electrodes EL1. The second electrode EL2 is located above the first electrodes EL1, that is, in other words, it is located on a protective member 8 side as compared to the first electrodes EL1. In the example illustrated, the lower surface of the second electrode EL2 is in contact with the organic piezoelectric material PZ, but the lower surface of the second electrode EL2 may be covered by an insulating film. In the example illustrated, the upper surfaces of the first electrodes EL1 are in contact with the organic piezoelectric material PZ, but the upper surfaces of the first electrodes EL1 may be covered by an insulating film.

In the first embodiment, when voltage is applied to the first electrodes EL1 and the second electrode EL2, a vertical electric field EF1 along the third direction D3 is generated. By applying an electric field to the organic piezoelectric material PZ, a polarization treatment (poling) can be applied to the organic piezoelectric material PZ. Based on the direction of the electric field applied to the organic piezoelectric material PZ, the direction of the pressure that can be sensed by the flexible substrate 100 is determined. To the organic piezoelectric material PZ, a vertical electric field EF1 as shown in FIG. 5 or a horizontal electric field EF2, which will be described later, can be applied. By generating the vertical electric field EF1 on the organic piezoelectric material PZ, the pressure generated in the third direction D3, that is, in other words, the thickness direction of the flexible substrate 100 can be sensed. Also, by generating a horizontal electric field on the organic piezoelectric material PZ, the pressure generated in the direction of the D1-D2 plane, that is, in the plane direction of the flexible substrate 100, can be sensed. Here, note that when the polarization treatment is carried out by a vertical electric field, the pressure in the thickness direction is mainly detected, but the pressure in the plane direction can as well be detected though very weakly. When subjected to the polarization treatment by a horizontal electric field, the pressure in the plane direction is mainly detected, but the pressure in the thickness direction can as well be detected weakly. In other words, it is difficult to detect pressure in the region where the organic piezoelectric material PZ which is not subjected to the polarization treatment, is located.

Figure 6:
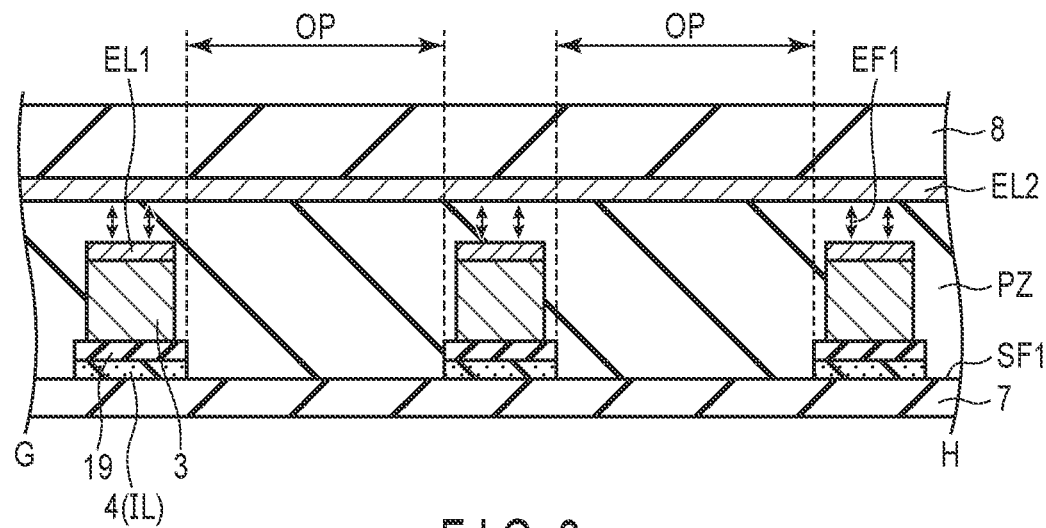
FIG. 6 is a cross-sectional view schematically showing a part of the flexible substrate shown in FIG. 2, taken along line G-H.

FIG. 6 is a cross-sectional view schematically showing a part of the flexible substrate 100 shown in FIG. 2, taken along line G-H. The organic piezoelectric material PZ is in contact with the first surface SF1 of the support plate 7 in the openings OP. The second electrode EL2 overlap the multiple openings OP, respectively.

According to this embodiment, the organic piezoelectric material PZ is formed over substantially the entire surface of the flexible substrate 100. Therefore, the function of the pressure sensor can be added to the entire surface of the flexible substrate 100. In other words, it is possible to form a flexible substrate 100 that can be affixed to a curved surface to sense the pressure. Further, the organic piezoelectric material PZ has such characteristics that the material thereof deteriorates during the patterning and it is weak against heat, and therefore it is difficult to pattern. However, in the configuration of this embodiment, the organic piezoelectric material PZ is applied to the entire surface of the flexible substrate 100, and therefore patterning of the organic piezoelectric material PZ is not required. This, the processing step of patterning is omitted, and the function of the pressure sensor can be added to the flexible substrate 100 at low cost. In the first embodiment, the organic piezoelectric material PZ is subjected to the polarization treatment (poling) by the vertical electric field generated by applying voltage to the first electrodes EL1 and the second electrode EL2, and therefore the pressure generated in the thickness direction of the flexible substrate 100 can be sensed.

In the example illustrated, the second electrode EL2 overlaps the multiple first electrodes EL1 continuously, but in the first embodiment, it suffices if the second electrode EL2 is placed in a position overlapping the first electrodes EL1.

Figure 7:
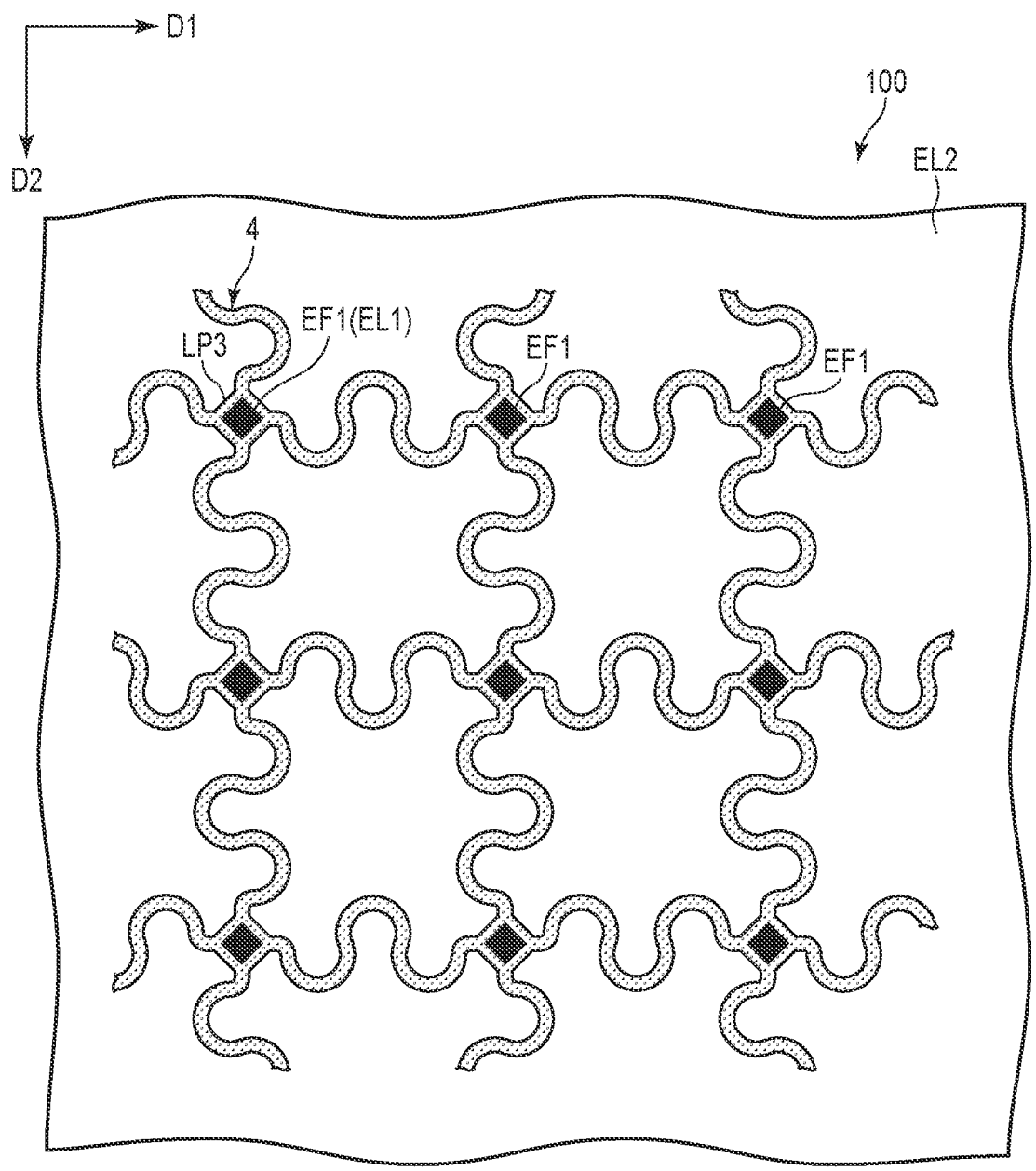
FIG. 7 is a plan view showing an electric field produced in the flexible substrate of the first embodiment.

FIG. 7 is a plan view showing the electric field generated in the flexible substrate 100 of the first embodiment.

The first electrodes EL1 are located on the island-shaped portions IP, respectively. In the first embodiment, the positions where the first electrodes EL1 and the second electrode EL2 overlap are the positions subjected to the polarization treatment by the vertical electric field EF1. Therefore, pressure can be sensed only in the predetermined regions, and pressure detection outside the predetermined regions can be suppressed.

Figure 8:
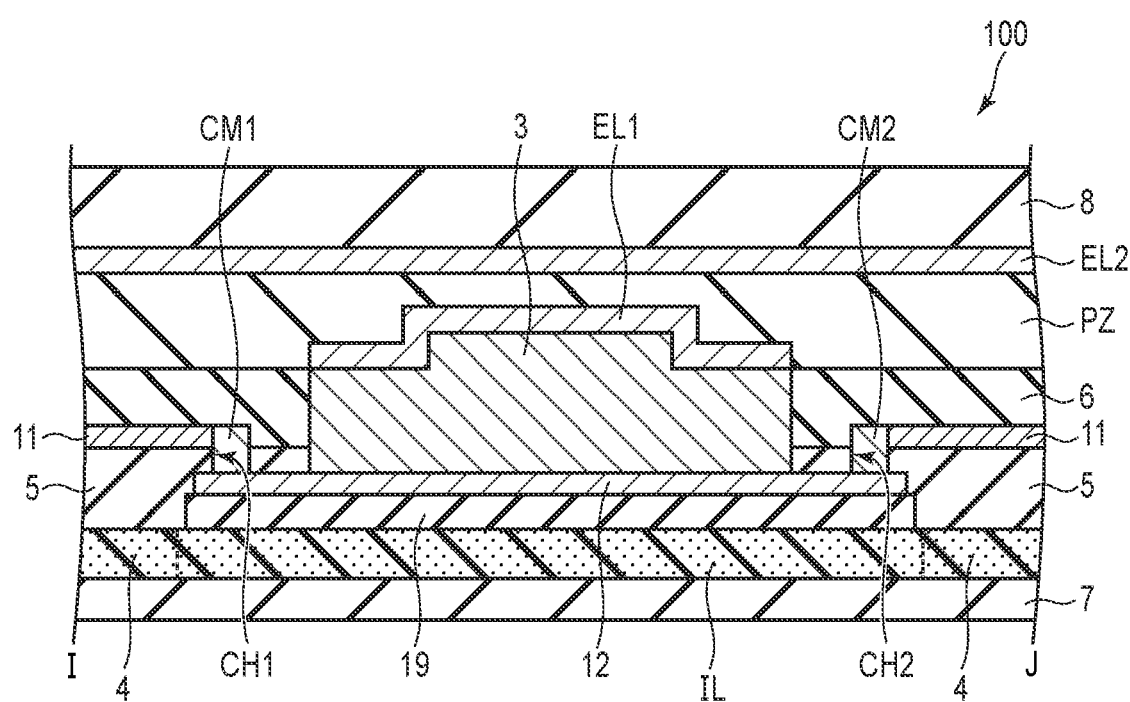
FIG. 8 is a cross-sectional view schematically showing a part of the flexible substrate shown in FIG. 2, taken along line I-J.

FIG. 8 is a cross-sectional view schematically showing a part of the flexible substrate 100 shown in FIG. 2, taken along line I-J.

The first portions 11 of each scanning line 1 is disposed on the first organic insulating film 5 and covered by the second organic insulating film 6. The second portion 12 of the scanning line 1 is disposed on the inorganic insulating layer 19 and is electrically connected to the respective electrical element 3. In the example shown in FIG. 8, both ends of the second portion 12 are covered by the first organic insulating film 5.

The first organic insulating film 5 is provided with contact holes CH1 and CH2. The first portions 11 are electrically connected to the second portion 12 via connection members CM1 and CM2 disposed in the contact holes CH1 and CH2, respectively. The connecting members CM1 and CM2 may be a part of the first portions 11 or may be provided separately from the first portion 11.

Between the electrical element 3 and the insulating base 4, an island-shaped inorganic insulating layer 19 is disposed. The inorganic insulating layer 19 functions as a protective film which inhibits the entering of moisture and the like into the electrical element 3 and the second portion 12 of the scanning line 1. With this configuration, the reliability of the flexible substrate 100 is improved. Further, generally, inorganic films are more prone to cracking than organic films, but because the inorganic insulating layer 19 is not provided below the first portion 11 of the scanning line 11, disconnection in the first portion 11 can be suppressed. This is also the case for the signal lines, which are not shown in the figure. Furthermore, compared to the case where the inorganic insulating layer 19 is provided over the entire flexible substrate 100, the elasticity and flexibility of the flexible substrate 100 are not easily degraded. Further, in the scanning line 1, since the second portion 12 superimposed on the electrical element 3 is located in a layer different from that of the first portion 11, the degree of freedom of design in the vicinity of the electrical element 3 is improved.

The island-shaped portions IL of the insulating base 4 are located below the electrical elements 3, respectively. With this configuration, the electrical elements 3 can be well supported. Further, the insulating base 4 is supported by the support plate 7. Therefore, the overall strength of the flexible substrate 100 is increased and the entering of moisture and the like from below can be suppressed.

Second Embodiment

Next, the second embodiment will be described. According to the second embodiment, the organic piezoelectric material PZ is subjected to the polarization treatment with a horizontal electric field, to enable to sense a pressure generated in the plane direction of the flexible substrate 100. The second embodiment is different from the first embodiment in that the second electrode EL2 is located below the first electrodes EL1.

Figure 9:
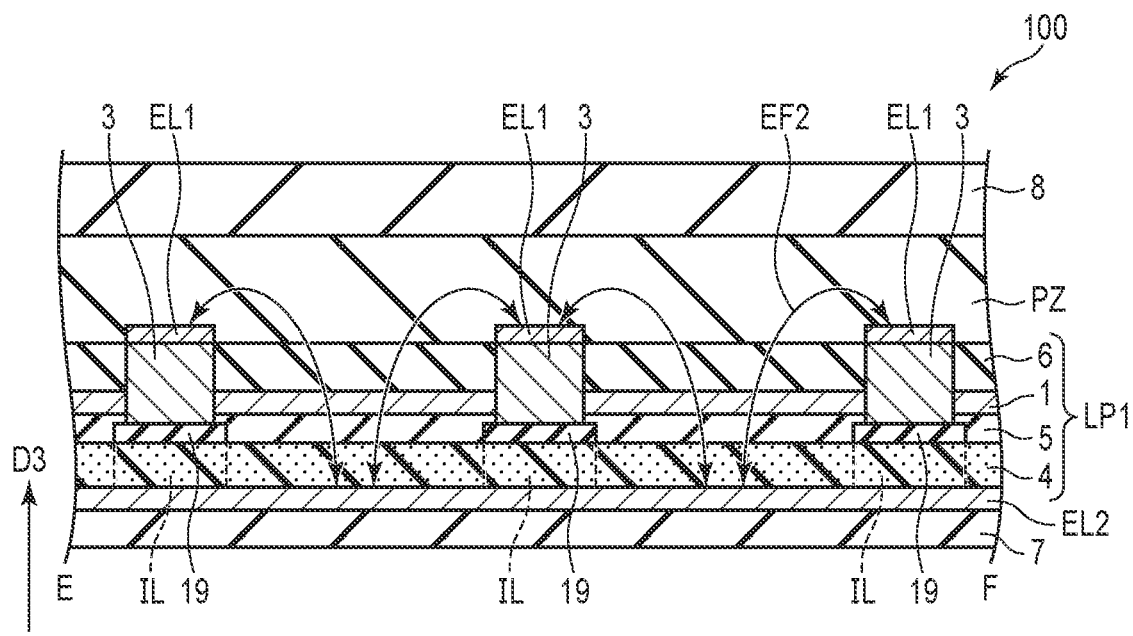
FIG. 9 is a cross-sectional view schematically showing a part of the flexible substrate shown in FIG. 2, taken along line E-F.

FIG. 9 is a cross-sectional view schematically showing a part of the flexible substrate 100 shown in FIG. 2, taken along line E-F. The configuration shown in FIG. 9 is different from that of FIG. 5 in that the second electrode EL2 is located between the insulating base 4 and the support plate 7. In other words, the second electrode EL2 is located below the first electrodes EL1.

The organic piezoelectric material PZ is in contact with the protective material 8. The second electrode EL2 opposes the first electrodes EL1 via the insulating base 4. In the example illustrated, the second electrode EL2 continuously opposes the multiple first electrodes EL1. Note that in the example illustrated, the upper surfaces of the first electrodes EL1 are in contact with the organic piezoelectric material PZ, but the upper surfaces of the first electrodes EL1 may be covered by an insulating film.

Figure 10:
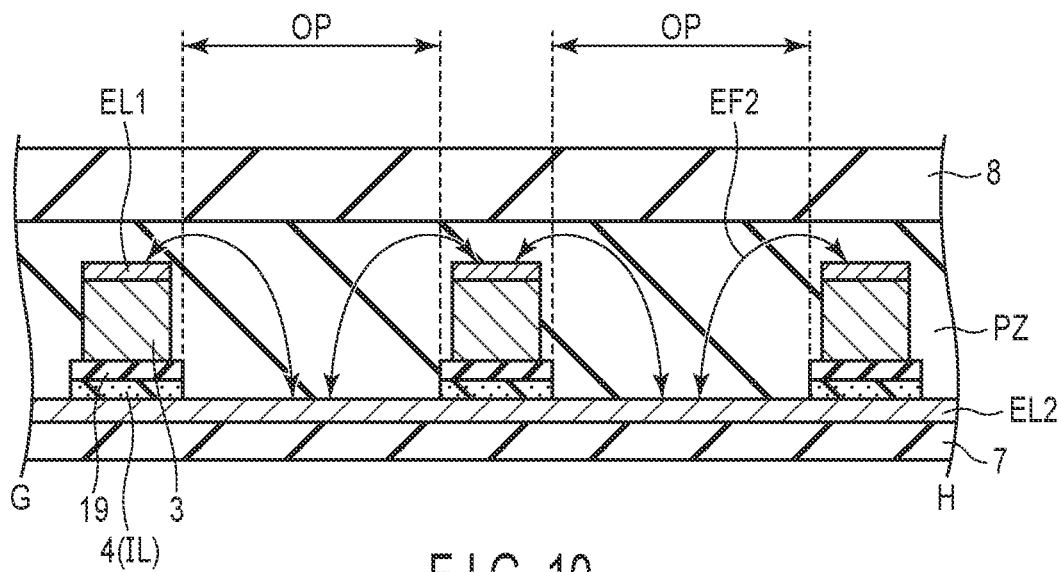
FIG. 10 is a cross-sectional view schematically showing a part of the flexible substrate shown in FIG. 2, taken along line G-H.

FIG. 10 is a cross-sectional view schematically showing a part of the flexible substrate 10H shown in FIG. 2, taken along line G-H. The configuration shown in FIG. 10 is different from that of FIG. 6 in that the second electrode EL2 is located between the insulating base 4 and the support plate 7.

The organic piezoelectric material PZ is in contact with the second electrode EL2 in the openings OP. The second electrode EL2 overlaps the multiple openings OP.

In the second embodiment, when voltage is applied to the first electrode EL1 and the second electrode EL2 2, a horizontal electric field EF2 along the plane direction of the flexible substrate 100 is generated. Thus, by subjecting the organic piezoelectric material PZ to the polarization treatment by the horizontal electric field EF2, the pressure generated in the direction of the D1-D2 plane can be sensed as shown in FIG. 11.

Figure 11:
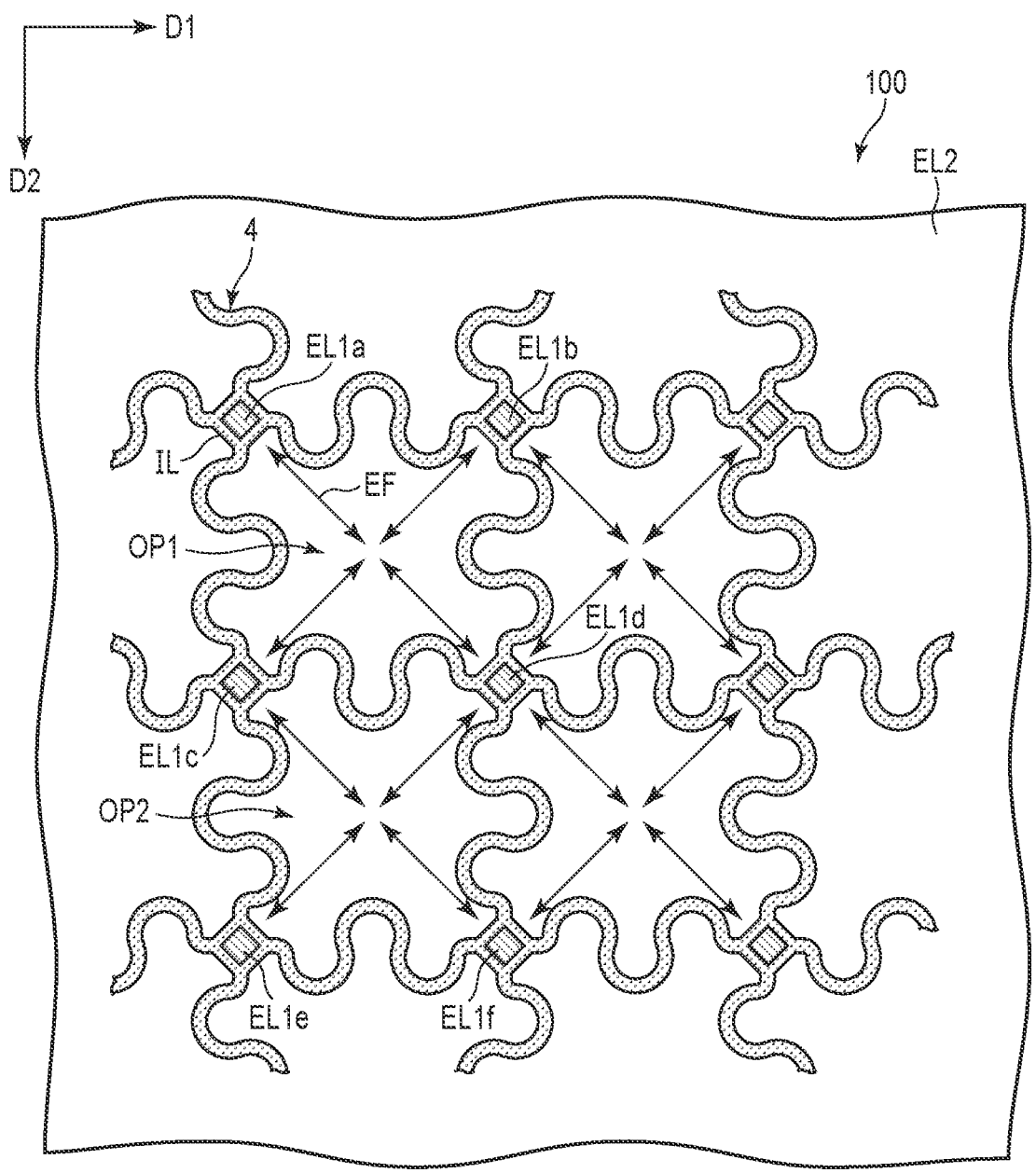
FIG. 11 is a plan view showing an electric field produced in a flexible substrate of the second embodiment.

FIG. 11 is a plan view showing the electric field generated in the flexible substrate 100 of the second embodiment.

In the second embodiment, the polarization treatment is carried out on not only in the regions where the first electrodes EL1 and the second electrode EL2 overlap, but also in the regions where they overlap the openings OP. Let us focus here on the openings OP1 and first electrodes EL1a, EL1b, EL1c and EL1d located at the four corners of each opening OP1, for example. In this case, the horizontal electric field EF2 is generated between the first electrodes EL1a, EL1b, EL1c and EL1d and the second electrode EL2 located within the openings OP1. Therefore, the pressure can be sensed not only in the predetermined regions, such as the positions where the first electrodes EL1 and the second electrode EL2 overlap, but also in the entire surface of the flexible substrate 100.

Third Embodiment

Next, the third embodiment will be described. According to the third embodiment, the organic piezoelectric material PZ is subjected to the polarization treatment with a horizontal electric field, to enable to sense a pressure generated in the plane direction of the flexible substrate 100. The third embodiment is different from the first embodiment in that the second electrode EL2 is not provided.

Figure 12:
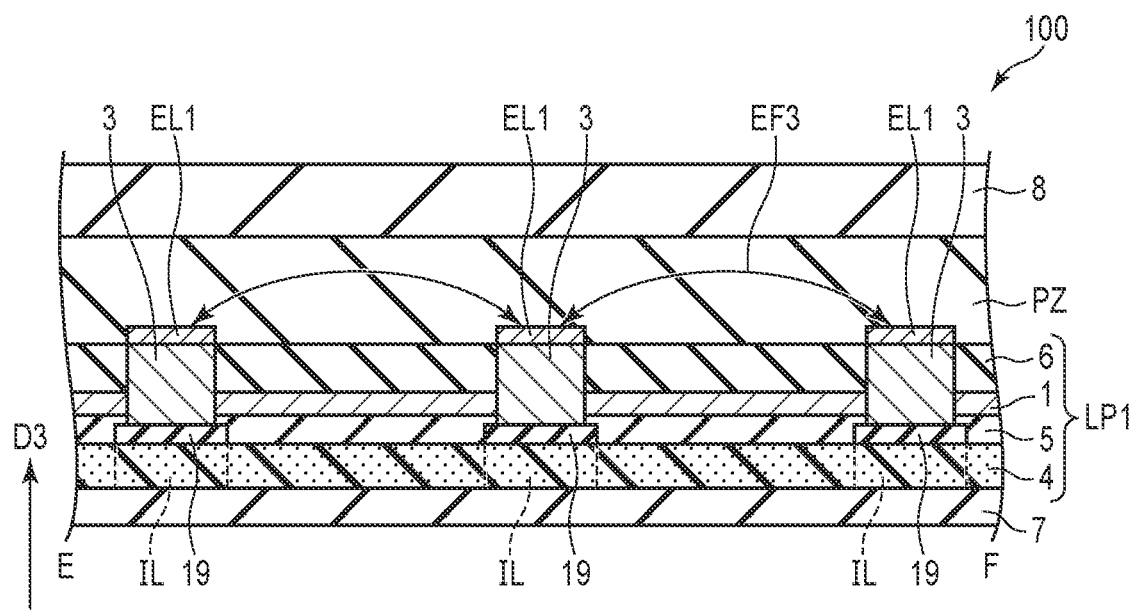
FIG. 12 is a cross-sectional view schematically showing a part of the flexible substrate shown in FIG. 2, taken along line E-F.

FIG. 12 is a cross-sectional view schematically showing a part of the flexible substrate 10 shown in FIG. 2, taken along line E-F. The configuration shown in FIG. 12 is different from that of FIG. 5 in that the second electrode EL2 is not formed.

The organic piezoelectric material PZ is in contact with the protective member 8. In the example illustrated, the upper surfaces of the first electrodes EL1 are in contact with the organic piezoelectric material PZ, but the upper surfaces of the first electrodes EL1 may be covered by an insulating film.

Figure 13:
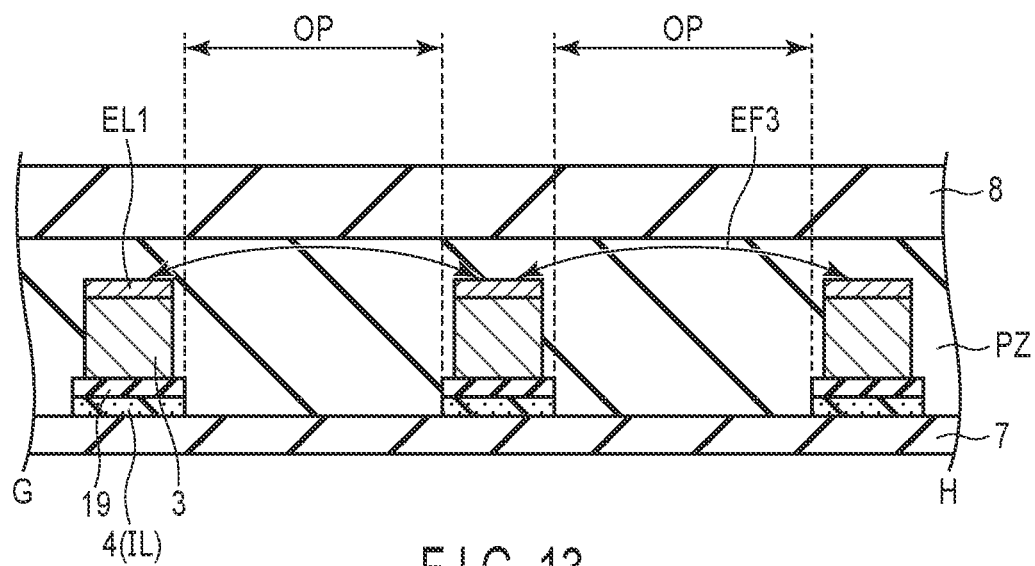
FIG. 13 is a cross-sectional view schematically showing a part of the flexible substrate shown in FIG. 2, taken along line G-H.

FIG. 13 is a cross-sectional view schematically showing a part of the flexible substrate 10H shown in FIG. 2, taken along line G-H. The configuration shown in FIG. 13 is different from that of FIG. 6 in that the second electrode EL2 is not formed.

The organic piezoelectric material PZ is in contact with the support plate 7 in the openings OP.

In the third embodiment, when voltage is applied to the first electrodes EL1, a horizontal electric field EF3 along the plane direction of the flexible substrate 100 is generated. Thus, by subjecting the organic piezoelectric material PZ to the polarization treatment by the horizontal electric field EF3, the pressure generated in the direction of the D1-D2 plane can be sensed as shown in FIG. 14. In the third embodiment, as in the case of the second embodiment, a horizontal electric field is applied to the organic piezoelectric material PZ, but note here that in the second embodiment, the electric field is generated between the first electrodes EL1 and the second electrode EL2, whereas in the third embodiment, the electric field is generated between the first electrodes EL1.

FIG. 14 is a plan view showing the electric field generated in the flexible substrate 100 of the third embodiment.

In the third embodiment, a horizontal electric field EF3 can be generated between the first electrodes EL1. Here, let us focus on, for example, the opening OP1 and the first electrodes EL1a, EL1b, EL1c and EL1d located at the four corners of the opening OP1. In this case, the horizontal electric field EF3 is generated between each adjacent pair of the first electrodes EL1a, EL1b, EL1c and EL1d. Therefore, as in the second embodiment, the pressure can be sensed not only in the predetermined regions but also in the entire area of the flexible substrate 100.

As described above, according to this embodiment, it is possible to obtain a flexible substrate which can sense pressure.

In addition, the first embodiment shown in FIG. 6 and the second embodiment shown in FIG. 10 can be combined together. In other words, a third electrode may be provided to constitute such a configuration that the insulating base 4 and the electrical elements 3 are interposed between the second electrode EL2 and the third electrode 3. For example, the third electrode is located between the organic piezoelectric material PZ and the protective material 8 in addition to the configuration shown in FIG. 10. In this configuration, by applying the polarization treatment with a horizontal electric field as in the second embodiment, advantageous effects similar to those of the first and second embodiments can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
a support plate including a first surface;
a flexible insulating base located on the first surface; and
a wiring layer and a first electrode disposed on the insulating base,
wherein
the insulating base comprises a line portion on which the wiring layer is located and an island-shaped portion on which the first electrode is located,
the support plate, the line portion and the island-shaped portion are covered by a piezoelectric material, and
the piezoelectric material is covered by a protective member.

2. The flexible substrate of claim 1, further comprising:
a second electrode opposing the first electrode,
wherein
the second electrode is located between the piezoelectric material and the protective member.

3. The flexible substrate of claim 2, wherein
the piezoelectric material is in contact with the support plate, the first electrode, the second electrode and the insulating base.

4. The flexible substrate of claim 2, wherein
the line portion includes, in plan view, a plurality of first line portions extending along a first direction and arranged along a second direction intersecting the first direction and a plurality of second line portions extending along the second direction and arranged along the first direction,
the island-shaped portion is provided in each of intersection portions of the first line portions and the second line portions,
the piezoelectric material is in contact with the support plate in each of regions surrounded by the first line portions and the second line portions, and
the second electrode is provided to overlap the regions.

5. The flexible substrate of claim 4, wherein
the piezoelectric material is located between the insulating base and the protective member in a position overlapping each of the first line portion and the second line portion, and
the piezoelectric material is located between the support plate and the protective member in the regions.

6. The flexible substrate of claim 1, further comprising:
a second electrode opposing the first electrode,
wherein
the second electrode is located between the insulating base and the support plate.

7. The flexible substrate of claim 1, wherein
the line portion includes, in plan view, a plurality of first line portions extending along a first direction and arranged along a second direction intersecting the first direction and a plurality of second line portions extending along the second direction and arranged along the first direction, the island-shaped portion is provided in each of intersection portions of the first line portions and the second line portions, and the first line portions and the second line portions have a wavy shape in plan view.

8. The flexible substrate of claim 1, wherein the piezoelectric material is an organic piezoelectric material.

\* \* \* \* \*